United States Patent
Okita et al.

(10) Patent No.: US 10,985,693 B2
(45) Date of Patent: Apr. 20, 2021

(54) ARC DETECTION DEVICE AND ARC DETECTION METHOD

(71) Applicant: Panasonic Intellectual Property Management Co., Ltd., Osaka (JP)

(72) Inventors: Atsushi Okita, Osaka (JP); Tatsuo Koga, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 92 days.

(21) Appl. No.: 16/478,799

(22) PCT Filed: Dec. 7, 2017

(86) PCT No.: PCT/JP2017/044047
§ 371 (c)(1),
(2) Date: Jul. 17, 2019

(87) PCT Pub. No.: WO2018/150696
PCT Pub. Date: Aug. 23, 2018

(65) Prior Publication Data
US 2019/0372522 A1    Dec. 5, 2019

(30) Foreign Application Priority Data

Feb. 14, 2017  (JP) .............................. JP2017-025358

(51) Int. Cl.
*H02S 50/00* (2014.01)
*G01R 31/12* (2020.01)

(52) U.S. Cl.
CPC .............. *H02S 50/00* (2013.01); *G01R 31/12* (2013.01)

(58) Field of Classification Search
None
See application file for complete search history.

(56) References Cited

U.S. PATENT DOCUMENTS

2007/0121261 A1* 5/2007 Sung .................... H02H 1/0015
                                                                          361/42
2017/0324236 A1  11/2017 Tomita et al.

FOREIGN PATENT DOCUMENTS

JP          2016-151514 A       8/2016

OTHER PUBLICATIONS

International Search Report issued in corresponding International Patent Application No. PCT/JP2017/044047, dated Mar. 6, 2018, with English translation.

* cited by examiner

*Primary Examiner* — Paresh Patel
(74) *Attorney, Agent, or Firm* — McDermott Will & Emery LLP

(57) ABSTRACT

In an arc detector, a frequency analyzer analyzes frequency components of a current subject to detection in a first frequency band. A detector detects an occurrence of an arc by referring to the frequency components in the first frequency band. When the detector does not detect the occurrence of an arc by referring to the frequency components in the first frequency band, the frequency analyzer analyzes frequency components of the current subject to detection in a second frequency band lower than the first frequency band, and the detector detects the occurrence of an arc by referring to the frequency components in the second frequency band.

5 Claims, 3 Drawing Sheets

ARC DETECTION DEVICE AND ARC DETECTION METHOD

CROSS-REFERENCE TO RELATED APPLICATIONS

This application is the U.S. National Phase under 35 U.S.C. § 371 of International Application No. PCT/JP2017/044,047, filed on Dec. 7, 2017, which claims the benefit of Japanese Application No. 2017-025,358, filed on Feb. 14, 2017, the entire contents of each are hereby incorporated by reference.

TECHNICAL FIELD

The present disclosure relates to an arc detector and an arc detection method for detecting an arc.

BACKGROUND ART

In a solar power generation system, an arc may occur due to a damage to wirings, terminals, etc. In the event that an arc occurs, it is preferred to cut off a circuit promptly. For this reason, an arc detector is used to detect an arc. For example, patent document 1 discloses an arc detector adapted to detect a current flowing in the wirings and detect the occurrence of an arc when the frequency components of the detected current around 10-100 kHz are higher than a threshold value.

[patent document 1] JP2016-151514

Technical Problem

The arc detector described above only uses the frequency components around 10-100 kHz and so may not be able to detect the occurrence of an arc, depending on the condition such as the material of the wirings, the voltage, etc.

The disclosure addresses the above-described issue, and a general purpose thereof is to provide an arc detector and an arc detection method capable of detecting the occurrence of an arc with a higher sensitivity than in the related art.

Solution to Problem

An arc detector according to an embodiment of the present disclosure includes: a frequency analyzer that analyzes frequency components of a current subject to detection in a first frequency band; and a detector that detects an occurrence of an arc by referring to the frequency components in the first frequency band. When the detector does not detect the occurrence of an arc by referring to the frequency components in the first frequency band, the frequency analyzer analyzes frequency components of the current subject to detection in a second frequency band lower than the first frequency band, and the detector detects the occurrence of an arc by referring to the frequency components in the second frequency band.

Another embodiment of the present disclosure relates to an arc detection method. The method includes: analyzing frequency components of a current subject to detection in a first frequency band; detecting an occurrence of an arc by referring to the frequency components in the first frequency band; when the occurrence of an arc is not detected by referring to the frequency components in the first frequency band, analyzing frequency components of the current subject to detection in a second frequency band lower than the first frequency band; and detecting the occurrence of an arc by referring to the frequency components in the second frequency band.

Advantageous Effects of Invention

According to the present disclosure, an arc can be detected with a higher sensitivity than in the related art.

DESCRIPTION OF EMBODIMENTS

Figure 1:
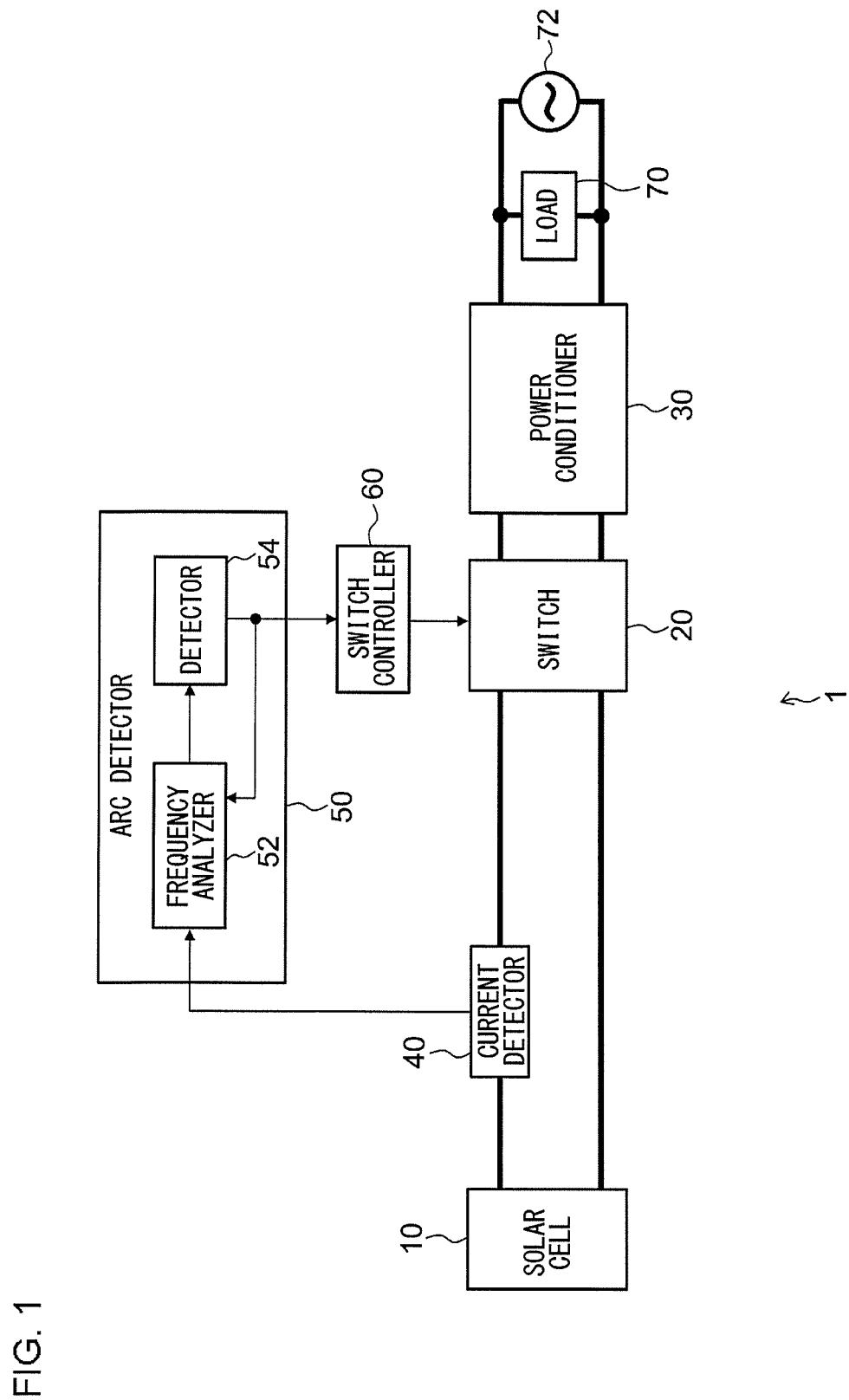
FIG. 1 shows a configuration of a power conversion system including an arc detector according to the embodiment.

FIG. 1 shows a configuration of a power conversion system 1 including an arc detector 50 according to the embodiment. The power conversion system 1 includes a solar cell 10, a switch 20, a power conditioner 30, a current detector 40, an arc detector 50, and a switch controller 60.

The solar cell 10 is a power generator that uses photovoltaic effect to convert light energy into electric power directly and functions as a DC power source. A silicon solar cell, a solar cell made of a compound semiconductor, a dye-sensitized solar cell (organic solar cell) or the like is used as the solar cell 10. A DC power supply such as a storage battery, an electric double layer capacitor, a fuel cell, or the like may be connected in place of the solar cell 10.

The switch 20 is provided in a current route between the solar cell 10 and the power conditioner 30 and switches conduction between the solar cell 10 and the power conditioner 30 into an on state or an off state. During a normal operation, the switch 20 is in a closed state and establishes conduction between the solar cell 10 and the power conditioner 30.

The power conditioner 30 converts the power generated by the solar cell 10 into an AC power and supplies the AC power as converted to a load 70 and a power system 72. The solar cell 10, the switch 20, and the power conditioner 30 are connected by a copper wire.

The current detector 40 is provided between the solar cell 10 and the switch 20 and detects a current subject to detection (DC current) output from the solar cell 10. The current detector 40 is exemplified by a current transformer (CT).

The arc detector 50 detects the occurrence of an arc by referring to the subject current (current subject to detection) detected by the current detector 40. An arc could occur in the current route between the solar cell 10 and the power conditioner 30 due to a damage to the wirings, the terminals, etc.

The arc detector 50 includes a frequency analyzer 52 and a detector 54. The frequency analyzer 52 analyzes the frequency components of the subject current in the first frequency band. For example, the frequency analyzer 52 converts the subject current into a digital signal and subjects the digital signal to high-speed frequency transform so as to obtain a power spectrum in the first frequency band. For example, the first frequency band is 10 kHz-100 kHz.

The detector 54 detects the occurrence of an arc by referring to the frequency components in the first frequency band analyzed by the frequency analyzer 52. More specifically, the detector 54 detects the occurrence of an arc when the frequency components in the first frequency band are higher than a predetermined first threshold value and does not detect an arc when the frequency components in the first frequency band are equal to or lower than the first threshold value. When the occurrence of an arc is detected, the detector 54 notifies the switch controller 60 accordingly.

When an arc is not detected by the detector 54 by referring to the frequency components in the first frequency band, the frequency analyzer 52 analyzes the frequency components of the subject current in the second frequency band. For example, the frequency analyzer 52 converts the subject current into a digital signal and subjects the digital signal to high-speed Fourier transform so as to obtain a power spectrum in the second frequency band. The second frequency band is lower than the first frequency band and is, for example, 10 Hz-100 Hz. For this reason, the time required to analyze the frequency components in the second frequency band is longer than the time required to analyze the frequency components in the first frequency band.

In this case, the detector 54 detects the occurrence of an arc by referring to the frequency components in the second frequency band analyzed by the frequency analyzer 52. More specifically, the detector 54 detects the occurrence of an arc when the frequency components in the second frequency band are higher than a predetermined second threshold value and does not detect the occurrence of an arc when the frequency components in the second frequency band are equal to or lower than the second threshold value. The detector 54 notified the switch controller 60 when the occurrence of an arc is detected.

Further, when the detector 54 detects the occurrence of an arc by referring to the frequency components in the first frequency band, the frequency analyzer 52 does not analyze the frequency components of the subject current in the second frequency band. This prevents unnecessary analysis from being performed.

The optimum values of the first frequency band, the second frequency band, the first threshold value, and the second threshold value can be defined as appropriate by an experiment or a simulation.

The configuration of the arc detector 50 can be implemented by the coordination of hardware resources and software resources or only by hardware resources. An analog device, microcomputer, DSP, ROM, RAM, FPGA, and other LSIs can be used as hardware resources. Programs such as firmware can be used as software resources.

When notified by the detector 54 of the occurrence of an arc, the switch controller 60 controls the switch 20 into an open state and electrically releases the connection between the solar cell 10 and the power conditioner 30. This cuts off a current flowing from the solar cell 10 to the power conditioner 30 and extinguishes the arc.

A description will now be given of a result of an experiment in which an arc is generated by using an experiment device.

Figure 2:
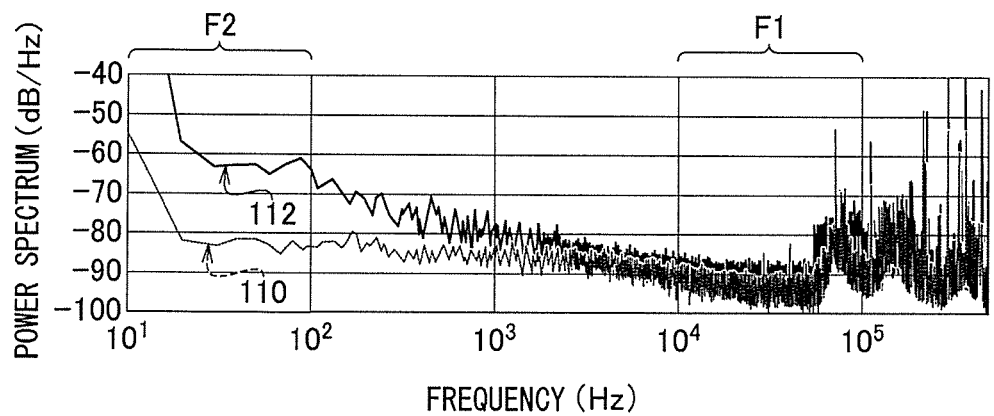
FIG. 2 shows a power spectrum of a current that flows when an arc occurs in the wirings of the first material and that of a current that flows when an arc does not occur.

FIG. 2 shows a power spectrum of a current that flows when an arc occurs in the wirings of the first material and that of a current that flows when an arc does not occur. Referring to FIG. 2, a reference power spectrum 110 is calculated by using a current that flows when an arc does not occur. A power spectrum 112 is calculated by using a current that flows when an arc occurs.

The frequency components of the power spectrum 112 in the first frequency band F1 are higher than the frequency components of the reference power spectrum 110 in the first frequency band F1. The frequency components of the power spectrum 112 in the second frequency band F2 are higher than the frequency components of the reference power spectrum 110 in the second frequency band F2.

Figure 3:
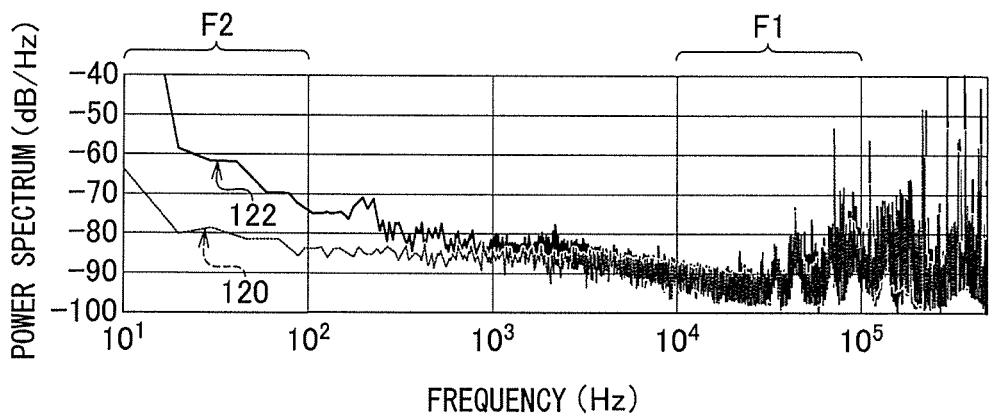
FIG. 3 shows a power spectrum of a current that flows when an arc occurs in the wirings of the second material and that of a current that flows when an arc does not occur.

FIG. 3 shows a power spectrum of a current that flows when an arc occurs in the wirings of the second material and that of a current that flows when an arc does not occur. The second material differs from the first material. Referring to FIG. 3, a reference power spectrum 120 is calculated by using a current that flows when an arc does not occur. A power spectrum 122 is calculated by using a current that flows when an arc occurs.

The frequency components of the power spectrum 122 in the first frequency band F1 are substantially equal to the frequency components of the reference power spectrum 120 in the first frequency band F1. The frequency components of the power spectrum 122 in the second frequency band F2 are higher than the frequency components of the reference power spectrum 120 in the second frequency band F2.

Thus, the experiment shows that the amount by which the frequency components in the first frequency band F1 increase when an arc occurs differs depending on the material of the wirings. In the case of the wirings of the second material, the frequency components in the first frequency band F1 hardly change even when an arc occurs.

By setting, in the arc detector 50, the first threshold value to be higher than the values of the frequency components of the reference power spectrum 110 in the first frequency band F1 and lower than the values of the frequency components of the power spectrum 112 in the first frequency band F1, the occurrence of an arc is detected in the case of FIG. 2 by referring to the frequency components in the first frequency band F1. In the case of FIG. 3, the occurrence of an arc cannot be detected by referring to the frequency components in the first frequency band F1.

Meanwhile, the amount by which the frequency components in the second frequency band F2 increase when an arc occurs is large enough to be detected regardless of the material of the wirings. Thus, by setting the second threshold value to be higher than the values of the frequency components of the reference power spectrum 110 in the second frequency band F2 and lower than the values of the frequency components of the power spectrums 112, 122 in the first frequency band F1, the occurrence of an arc is detected in all cases of FIGS. 2 and 3 by referring to the frequency components in the second frequency band F2. Accordingly, the occurrence of an arc is detected by referring to the frequency components in the second frequency band F2 even when an arc occurs, but the occurrence of an arc cannot be detected by referring to the frequency components in the first frequency band F1.

Figure 4:
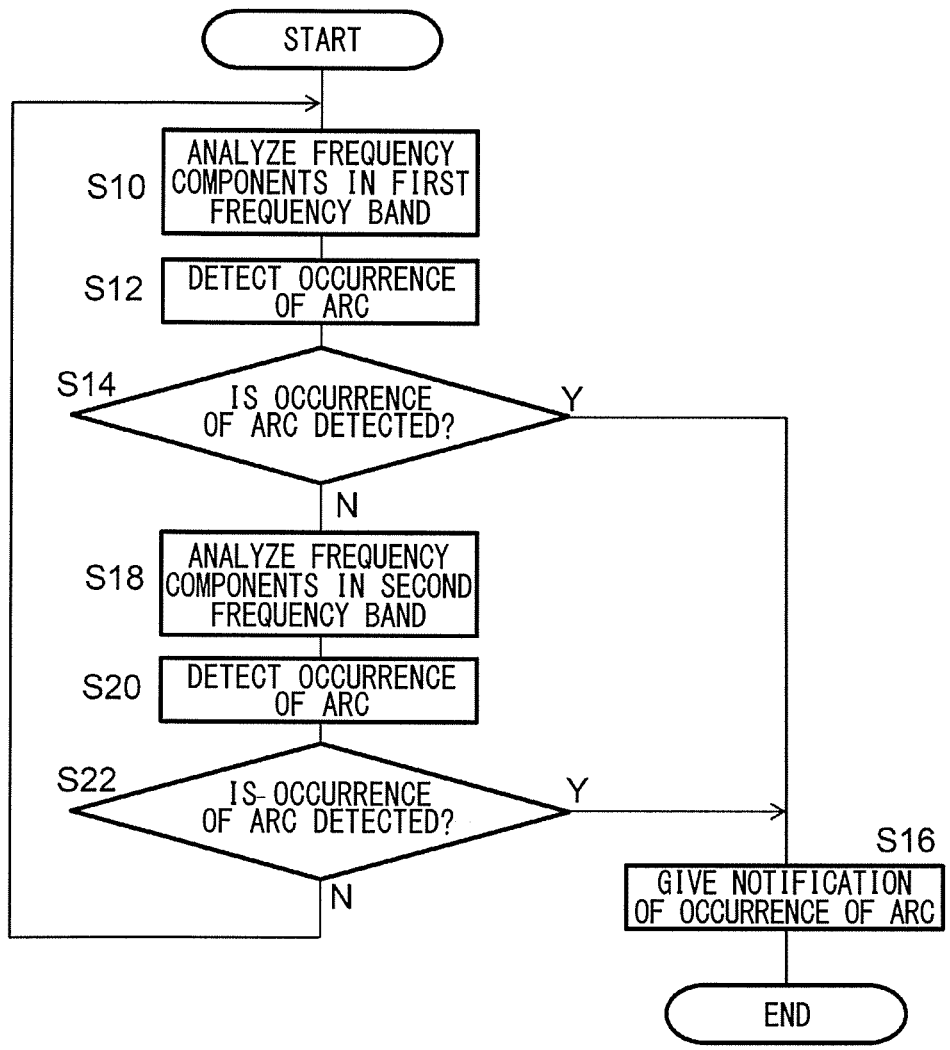
FIG. 4 is a flowchart showing the process performed in the arc detector of FIG. 1.

A description will now be given of the overall operation of the arc detector 50. FIG. 4 is a flowchart showing the process performed in the arc detector 50 of FIG. 1. First, the frequency analyzer 52 analyzes the frequency components of the subject current in the first frequency band (S10). The detector 54 then detects the occurrence of an arc by referring to the frequency components in the first frequency band analyzed in S10 (S12). When the occurrence of an arc is detected in S12 (Y in S14), the detector 54 notifies the switch controller 60 of the occurrence of an arc (S16) and terminates the process.

When the occurrence of an arc is not detected in S12 (N in S14), on the other hand, the frequency analyzer 52 analyzes the frequency components of the subject current in the second frequency band (S18). The detector 54 then detects the occurrence of an arc by referring to the frequency components in the second frequency band analyzed in S18 (S20). When the occurrence of an arc is detected in S20 (Y in S22), control is shifted to S16. When the occurrence of an arc is not detected in S20 (N in S22), on the other hand, control returns to S10. In this way, the process of FIG. 4 is repeated until an arc is detected.

Thus, according to the embodiment, the occurrence of an arc is detected by referring to the frequency components of the subject current in the first frequency band. When an arc is not detected, the frequency components in the second frequency band are analyzed and the occurrence of an arc is detected by referring to the frequency components in the second frequency band. Analysis of the frequency components in the first frequency band, i.e., a higher frequency band, can be performed in a shorter period of time than analysis of the frequency components in the second frequency band, i.e., a lower frequency band. For this reason, the occurrence of an arc can be detected in a shorter period of time and at a higher speed when there is a change in the frequency components in the first frequency band.

The frequency components in the second frequency band, i.e., a lower frequency band, could increase or decrease more significantly than those in the first frequency band depending on whether there is an arc, regardless of the condition such as the material of the wirings. Accordingly, the occurrence of an arc is detected by referring to the frequency components in the second frequency band even when an arc occurs, but the occurrence of an arc cannot be detected by referring to the frequency components in the first frequency band. Accordingly, the occurrence of an arc can be detected with a higher sensitivity regardless of the condition such as the material of the wirings.

As discussed above, the occurrence of an arc in a high-voltage solar cell 10 is detected properly.

Described above is an explanation based on an exemplary embodiment. The embodiment is intended to be illustrative only and it will be understood by those skilled in the art that various modifications to constituting elements and processes could be developed and that such modifications are also within the scope of the present invention.

For example, the switch controller 60 may turn the switching element in the power conditioner 30 off when the arc detector 50 detects the occurrence of an arc. An arc can also be extinguished in this way.

The embodiments may be defined by the following items.
[Item 1]
An arc detector (50) including: a frequency analyzer (52) that analyzes frequency components of a current subject to detection in a first frequency band (F1); and a detector (54) that detects an occurrence of an arc by referring to the frequency components in the first frequency band (F1), wherein, when the detector (54) does not detect the occurrence of an arc by referring to the frequency components in the first frequency band (F1), the frequency analyzer (52) analyzes frequency components of the current subject to detection in a second frequency band (F2) lower than the first frequency band (F1), and the detector (54) detects the occurrence of an arc by referring to the frequency components in the second frequency band (F2).
[Item 2]
The arc detector (50) according to item 1, wherein, when the detector (54) detects the occurrence of an arc by referring to the frequency components in the first frequency band (F1), the frequency analyzer (52) does not analyze the frequency components of the current subject to detection in the second frequency band (F2).
[Item 3]
The arc detector (50) according to item 1 or 2, wherein the current subject to detection is a direct current.
[Item 4]
The arc detector (50) according to item 3, wherein the current subject to detection is a current output from a solar cell.
[Item 5]
A method of detecting an arc, including: analyzing (S10) frequency components of a current subject to detection in a first frequency band (F1); detecting (S12) an occurrence of an arc by referring to the frequency components in the first frequency band (F1); when the occurrence of an arc is not detected by referring to the frequency components in the first frequency band (F1), analyzing (S18) frequency components of the current subject to detection in a second frequency band (F2) lower than the first frequency band (F1); and detecting (S20) the occurrence of an arc by referring to the frequency components in the second frequency band (F2).

REFERENCE SIGNS LIST

1 . . . power conversion system, 10 . . . solar cell, 20 . . . switch, 30 . . . power conditioner, 40 . . . current detector, 50 . . . arc detector, 52 . . . frequency analyzer, 54 . . . detector, 60 . . . switch controller

INDUSTRIAL APPLICABILITY

The present disclosure is applicable to an arc detector for detecting the occurrence of an arc.

The invention claimed is:
1. An arc detector comprising:
a frequency analyzer that analyzes frequency components of a current subject to detection in a first frequency band; and
a detector that detects an occurrence of an arc by referring to the frequency components in the first frequency band, wherein
when the detector does not detect the occurrence of an arc by referring to the frequency components in the first frequency band, the frequency analyzer analyzes frequency components of the current subject to detection in a second frequency band lower than the first frequency band, and the detector detects the occurrence of an arc by referring to the frequency components in the second frequency band.
2. The arc detector according to claim 1, wherein
when the detector detects the occurrence of an arc by referring to the frequency components in the first frequency band, the frequency analyzer does not analyze the frequency components of the current subject to detection in the second frequency band.
3. The arc detector according to claim 1, wherein
the current subject to detection is a direct current.
4. The arc detector according to claim 3, wherein
the current subject to detection is a current output from a solar cell.
5. A method of detecting an arc, comprising:
analyzing frequency components of a current subject to detection in a first frequency band;

detecting an occurrence of an arc by referring to the frequency components in the first frequency band;

when the occurrence of an arc is not detected by referring to the frequency components in the first frequency band, analyzing frequency components of the current subject to detection in a second frequency band lower than the first frequency band; and detecting the occurrence of an arc by referring to the frequency components in the second frequency band.

\* \* \* \* \*